(12) United States Patent
Lee

(10) Patent No.: US 9,647,497 B2
(45) Date of Patent: May 9, 2017

(54) WIRELESS POWER TRANSMITTER

(71) Applicant: LG INNOTEK CO., LTD., Seoul (KR)

(72) Inventor: Jung Oh Lee, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 710 days.

(21) Appl. No.: 14/103,410

(22) Filed: Dec. 11, 2013

(65) Prior Publication Data

US 2014/0167522 A1   Jun. 19, 2014

(30) Foreign Application Priority Data

Dec. 14, 2012   (KR) .......................... 10-2012-0146957

(51) Int. Cl.
| | |
|---|---|
| *H01F 27/42* | (2006.01) |
| *H01F 37/00* | (2006.01) |
| *H01F 38/00* | (2006.01) |
| *H02J 50/00* | (2016.01) |
| *H01F 38/14* | (2006.01) |
| *H05K 7/20* | (2006.01) |
| *H02J 5/00* | (2016.01) |
| *H02J 7/02* | (2016.01) |

(52) U.S. Cl.
CPC .............. *H02J 50/00* (2016.02); *H01F 38/14* (2013.01); *H02J 5/005* (2013.01); *H05K 7/20009* (2013.01); *H05K 7/2039* (2013.01); *H02J 7/025* (2013.01)

(58) Field of Classification Search
CPC .. H02J 5/005; H02J 7/025; H02J 17/00; H02J 50/00; H01F 38/14
USPC .......................................................... 307/104
See application file for complete search history.

(56) References Cited

FOREIGN PATENT DOCUMENTS

| CN | 101252040 A | | 8/2008 |
|---|---|---|---|
| JP | H11111439 A | | 4/1999 |
| JP | 2000133536 A | * | 5/2000 |
| JP | 2000133536 A | | 5/2000 |
| JP | 2012130177 A | | 7/2012 |
| KR | 1020120109892 A | | 9/2012 |
| WO | WO-2007137682 A2 | | 12/2007 |
| WO | WO-2010026805 A1 | | 3/2010 |

OTHER PUBLICATIONS

European Search Report dated May 21, 2015 in European Application No. 13196136.9.
Office Action dated Jun. 2, 2015 in Chinese Application No. 201310688336.7.
European Search Report dated May 3, 2016 in European Application No. 15203165.4.

* cited by examiner

*Primary Examiner* — Carlos Amaya
(74) *Attorney, Agent, or Firm* — Saliwanchik, Lloyd & Eisenschenk

(57) ABSTRACT

Disclosed is a wireless power transmitter. The wireless power transmitter includes a coil in a first case; a first passage groove having a shape corresponding to a shape of the first case; and a second case coupled to the first case.

16 Claims, 10 Drawing Sheets

| Part name | Material | Thermal Conductivity [W/m K] |
|---|---|---|
| CASE (top, bottom) | PC (polycarbonate) | 0.176 |
| Transmission Coil | Cu | 401 |
| PCB | PCB | 92.3 (Horizontal Direction) 0.9925 (Vertical Direction) |
| Shielding Unit | ferrite staiinless stell 430 | 26.1 (at100℃) |
| Magnet | ferrite staiinless stell 430 | 26.1 (at100℃) |
| Transmission Circuit | SiC | 125.6 |
| Power Inductor (FET) | SiC | 125.6 |
| Matching Capacitor | SiC | 125.6 |
| Heat Radiation Sheet | Silicone | 3.1 |

(a)

(b)

WIRELESS POWER TRANSMITTER

CROSS REFERENCE TO RELATED APPLICATION

The present application claims priority under 35 U.S.C. §119(a) of Korean Patent Application No. 10-2012-0146957 filed on Dec. 14, 2012, which is hereby incorporated by reference in its entirety.

BACKGROUND

The embodiment relates to a wireless power transmission technology. More particularly, the embodiment relates to a wireless power transmitter of wirelessly transmitting electric power.

A wireless power transmission or a wireless energy transfer refers to a technology of wirelessly transferring electric energy to desired devices. In the 1800's, an electric motor or a transformer employing the principle of electromagnetic induction has been extensively used and then a method for transmitting electrical energy by irradiating electromagnetic waves, such as radio waves or lasers, has been suggested. Actually, electrical toothbrushes or electrical razors, which are frequently used in daily life, are charged based on the principle of electromagnetic induction. The electromagnetic induction refers to a phenomenon in which voltage is induced so that current flows when a magnetic field is varied around a conductor. Although the commercialization of the electromagnetic induction technology has been rapidly progressed around small-size devices, the power transmission distance thereof is short.

Until now, wireless energy transmission schemes include a remote telecommunication technology based on a magnetic resonance scheme and a short wave radio frequency scheme in addition to the electromagnetic induction scheme.

Recently, among wireless power transmitting technologies, an energy transmitting scheme employing the electromagnetic induction scheme and the resonance scheme has been widely used.

Since a wireless power transmission system based on the electromagnetic induction scheme and the resonance scheme transmits electrical signals formed at transmitter and receiver sides through a coil in wireless, a user can easily charge an electronic device such as a portable device with electricity.

However, according to the related art, heat is generated from the transmission coil included in the wireless power transmitter due to a resistance component when current flows through the transmission coil, so that the wireless power transmitter is deteriorated. Thus, the heat is transferred to the wireless power receiver placed on the wireless power transmitter, so that the wireless power receiver is deteriorated.

One example of the related art is disclosed in Korean Patent Unexamined Publication No. 10-2007-0080057 entitled "Contactless charger system having heat-dissipating means and charging unit thereof".

BRIEF SUMMARY

The embodiment provides a wireless power transmitter capable of effectively radiating the heat of electronic components including a transmission coil.

According to an embodiment, there is provided a wireless power transmitter including a first case; a coil on the first case; a first passage groove having a shape corresponding to a shape of the coil; and a second case coupled to the first case.

According to another embodiment, there is provided a wireless power transmitter including a transmission coil to wirelessly transmit power to a wireless power receiver; an inlet device on one side of the transmission coil to supply air to the transmission coil; and a radiation unit to radiate heat of the transmission coil by changing a movement path of the supplied air.

DESCRIPTION OF THE DRAWINGS

FIG. 12 is a view showing properties of the elements of the wireless power transmitter 200 according to an embodiment.

DETAILED DESCRIPTION

Figure 1:
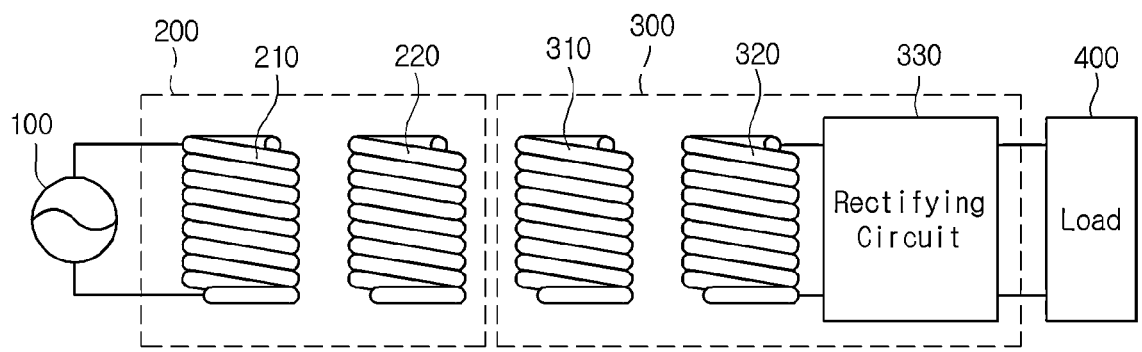
FIG. 1 is a block diagram showing a wireless power transmission system according to a first embodiment.

Hereinafter, embodiments will be described with reference to accompanying drawings. The thickness and size of each layer shown in the drawings may be exaggerated, omitted or schematically drawn for the purpose of convenience or clarity. In addition, the size of elements does not utterly reflect an actual size.

FIG. 1 is a block diagram showing a wireless power transmission system according to a first embodiment.

Referring to FIG. 1, the wireless power transmission system 10 may include a power supply device 100, a wireless power transmitter 200, a wireless power receiver 300 and a load 400.

The wireless power transmission system 10 shown in FIG. 1 may be a system in which the wireless power transmitter 200 wirelessly transmits power to the wireless power receiver 300 in a resonance scheme.

According to an embodiment, the power supply device 100 may be included in the wireless power transmitter 200, but the embodiment is not limited thereto.

The wireless power transmitter 200 may include a transmission induction coil 210 and a transmission resonant coil 220.

The wireless power receiver 300 may include a reception resonant coil 310, a reception induction coil 320 and a rectifying circuit 330.

Both terminals of the power supply device 100 are connected to both terminals of the transmission induction coil 210.

The transmission resonant coil 220 may be spaced apart from the transmission induction coil 210 by a predetermined distance.

The reception resonant coil 310 may be spaced apart from the reception induction coil 320 by a predetermined distance.

Both terminals of the reception induction coil 320 are connected to both terminals of the rectifying circuit 330, and the load 400 is connected to both terminals of the rectifying circuit 330. According to an embodiment, the load 400 may be included in the wireless power receiver 300.

The power generated from the power supply device 100 is transmitted to the wireless power transmitter 200. The power received in the wireless power transmitter 200 is transmitted to the wireless power receiver 300 that makes resonance with the wireless power transmitter 200 due to a resonance phenomenon, that is, has the resonance frequency the same as that of the wireless power transmitter 200.

The frequency bandwidth of the power transmitted from the wireless power transmitter 200 to the wireless power receiver 300 may be 6.78 MHz, but the embodiment is not limited thereto.

Hereinafter, the power transmission process will be described in more detail.

The power supply device 100 generates AC power having a predetermined frequency and transmits the AC power to the wireless power transmitter 200.

The transmission induction coil 210 and the transmission resonant coil 220 are inductively coupled with each other. In other words, if AC current flows through the transmission induction coil 210 due to the power received from the power supply apparatus 100, the AC current is induced to the transmission resonant coil 220 physically spaced apart from the transmission induction coil 210 due to the electromagnetic induction.

Thereafter, the power received in the transmission resonant coil 220 is transmitted to the wireless power receiver 300, which makes a resonance circuit with the wireless power transmitter 200, through resonance.

The transmission resonant coil 220 of the wireless power transmitter 200 may transmit power to the reception resonant coil 310 of the wireless power receiver 300 through a magnetic field.

In detail, the transmission resonant coil 220 and the reception resonant coil 310 are resonantly coupled with each other to be operated at the resonant frequency. Since the transmission resonant coil 220 is resonantly coupled with the reception resonant coil 310, the power transmission efficiency between the wireless power transmitter 200 and the wireless power receiver 300 may be significantly improved.

Power can be transmitted between two LC circuits, which are impedance-matched with each other, that is, between the transmission resonant coil 220 and the reception resonant coil 310 through resonance. The power transmitted through the resonance can be farther transmitted with higher efficiency when comparing with the power transmitted by the electromagnetic induction.

The reception resonant coil 310 receives power from the transmission resonant coil 220 through the resonance. The AC current flows through the reception resonant coil 310 due to the received power. The power received in the reception resonant coil 310 is transmitted to the reception induction coil 320, which is inductively coupled with the reception resonant coil 310, due to the electromagnetic induction. The power received in the reception induction coil 320 is rectified by the rectifying circuit 330 and transmitted to the load 400.

According to one embodiment, the transmission induction coil 210, the transmission resonant coil 220, the reception resonant coil 310, and the reception induction coil 320 may have a spiral structure in a plane spiral shape or a helical structure in a three-dimensional spiral shape, but the embodiment is not limited thereto.

A quality factor and a coupling coefficient are important in the wireless power transmission. That is, the greater the quality factor and the coupling coefficient values, the more the power transmission efficiency may be improved.

The quality factor may refer to an index of energy that may be stored in the vicinity of the wireless power transmitter 200 or the wireless power receiver 300.

The quality factor may vary according to the operating frequency ω as well as a shape, a dimension and a material of a coil. The quality factor may be expressed as following equation, $Q=\omega*L/R$. In the above equation, L refers to the inductance of a coil and R refers to resistance corresponding to the quantity of power loss caused in the coil.

The quality factor may have a value of 0 to infinity. When the quality factor has a greater value, the power transmission efficiency between the wireless power transmitter 200 and the wireless power receiver 300 may be more improved.

The coupling coefficient represents the degree of inductive magnetic coupling between a transmission coil and a reception coil, and has a value of 0 to 1.

The coupling coefficient may vary according to the relative position and the distance between the transmission coil and the reception coil.

The wireless power transmitter 200 may exchange information with the wireless power receiver 300 through in-band or out-of-band communication.

The in-band communication may refer to the communication for exchanging information between the wireless power transmitter 200 and the wireless power receiver 300 by using a signal having a frequency used in the wireless power transmission. The wireless power receiver 300 may further include a switch and may receive the power transmitted from the wireless power transmitter 200 through a switching operation of the switch or not. Thus, the wireless power transmitter 200 detects an amount of power consumed in the wireless power transmitter 200, so that the wireless power transmitter 200 may recognize an on or off signal of the switch included therein.

In detail, the wireless power receiver 300 may change an amount of power dissipated in a resistor by using the resistor and a switch, so that the power consumed in the wireless power transmitter 200 may be changed. The wireless power transmitter 200 may sense a change of the consumed power to obtain information about a state of the wireless power receiver 300. The switch and the resistor may be connected in series to each other. The information about a state of the wireless power receiver 300 may include information about a current charged amount and/or the change of charged amount of the wireless power receiver 300.

In more detail, when the switch is opened, the power dissipated in the resistor is 0 (zero) and the power consumed in the wireless power transmitter 200 is also reduced.

If the switch is shorted, the power absorbed in the resistor is more than 0 and the power consumed in the wireless power transmitter 200 is increased. While the wireless power receiver repeats the above operation, the wireless power transmitter 200 may detect the power consumed in the wireless power transmitter 200 and may perform digital communication with the wireless power receiver 300.

The wireless power transmitter 200 receives the information about the state of the wireless power receiver 300 according to the above operation, so that the wireless power transmitter 200 may transmit the power suitable to the reception state of the wireless power receiver 300.

To the contrary, the wireless power transmitter 200 may include a resistor and a switch to transmit the information about the state of the wireless power transmitter 200 to the wireless power receiver 300. According to one embodiment, the information about the state of the wireless power transmitter 200 may include information about the maximum amount of power to be supplied from the wireless power transmitter 200, the number of wireless power receivers 300 receiving the power from the wireless power transmitter 200 and the amount of available power of the wireless power transmitter 200.

The out-of-band communication refers to the communication performed through a specific frequency band other than the resonance frequency band in order to exchange information necessary for the power transmission. The wireless power transmitter 200 and the wireless power receiver 300 can be equipped with out-of-band communication modules to exchange information necessary for the power transmission. The out-of-band communication module may be installed in the power supply device. In one embodiment, the out-of-band communication module may use a short-distance communication technology, such as Bluetooth, Zigbee, WLAN or NFC, but the embodiment is not limited thereto.

Figure 2:
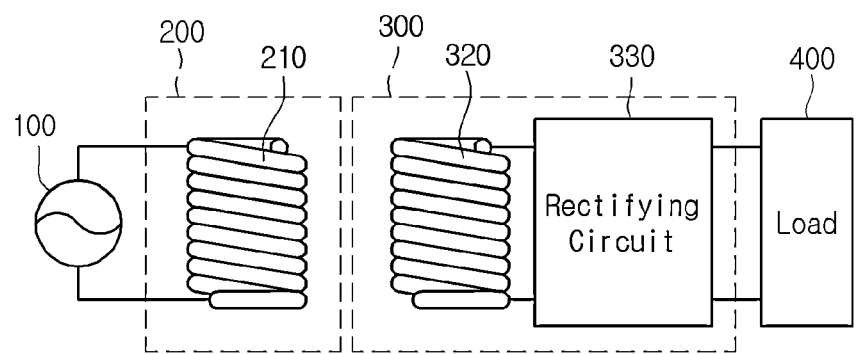
FIG. 2 is a block diagram showing a wireless power transmission system according to a second embodiment.

FIG. 2 is a block diagram showing a wireless power transmission system according to a second embodiment.

Referring to FIG. 2, the wireless power transmission system 20 may include a power supply device 100, a wireless power transmitter 200, a wireless power receiver 300 and a load 400.

The wireless power transmission system 20 shown in FIG. 2 may be a system in which the wireless power transmitter 200 wirelessly transmits power to the wireless power receiver 300 in an electromagnetic induction scheme.

According to an embodiment, the power supply device 100 may be included in the wireless power transmitter 200.

The wireless power transmitter 200 may include a transmission induction coil 210.

The wireless power receiver 300 may include a reception induction coil 320 and a rectifying circuit 330.

Both terminals of the power supply device 100 are connected to both terminals of the transmission induction coil 210.

The transmission induction coil 210 may be spaced apart from the reception induction coil 320 by a predetermined distance.

The wireless power transmitter 200 may transmit the power provided from the power supply device 100 to the wireless power receiver 300 through an electromagnetic induction scheme.

Hereinafter the power transmission process will be described in more detail.

The power supply device 100 generates AC power having a predetermined frequency and transmits the AC power to the wireless power transmitter 200.

The transmission induction coil 210 included in the wireless power transmitter 200 and the reception induction coil 320 included in the wireless power receiver 300 are inductively coupled with each other. In other words, if AC current flows through the transmission induction coil 210 due to the power supplied from the power supply apparatus 100, a magnetic field is formed in the transmission induction coil 210 so that the AC current is induced to the reception induction coil 320 physically spaced apart from the transmission induction coil 210 due to the electromagnetic induction to form a magnetic field. That is, the power transmission between the transmission induction coil 210 and the reception induction coil 320 may be performed through a magnetic field.

The frequency bandwidth of the power transmitted from the wireless power transmitter 200 to the wireless power receiver 300 may be in the range of 110 MHz to 205 MHz, but the embodiment is not limited thereto The power received in the reception induction coil 320 is rectified by the rectifying circuit 330 and transmitted to the load 400. The power transferred to the reception induction coil 320 is AC power.

Figure 3:
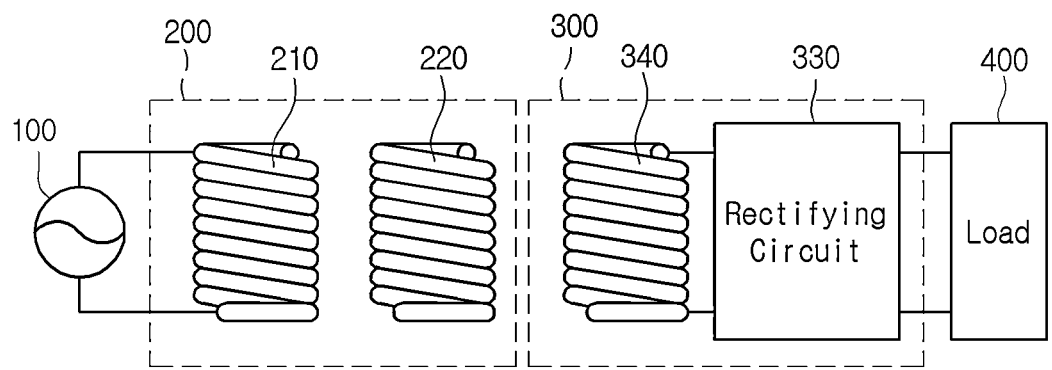
FIG. 3 is a block diagram showing a wireless power transmission system according to a third embodiment.

According to one embodiment, the transmission induction coil 210 and the reception induction coil 320 may have a spiral structure in a plane spiral shape or a helical structure in a three-dimensional spiral shape, but the embodiment is not limited thereto FIG. 3 is a block diagram showing a wireless power transmission system according to a third embodiment.

According to the third embodiment, the wireless power transmission system 30 may be a system in which the wireless power transmitter 200 wirelessly transmits power in an electromagnetic induction or resonance scheme.

Referring to FIG. 3, the wireless power transmission system 30 may include a power supply device 100, a wireless power transmitter 200, a wireless power receiver 300 and a load 400.

According to an embodiment, the power supply device 100 may be included in the wireless power transmitter 200.

The wireless power transmitter 200 may include a transmission induction coil 210 and a transmission resonant coil 220.

Both terminals of the transmission induction coil 210 may be connected to both terminals of the power supply device 100.

The transmission resonant coil 220 may be spaced apart from the transmission induction coil 210 by a predetermined distance.

The wireless power receiver 300 may include a reception coil 340 and a rectifying circuit 330.

Both terminals of the reception coil 340 is connected to both terminals of the rectifying circuit 330 and the load 400 is connected to both terminals of the rectifying circuit 330. According to an embodiment, the load 400 may be included in the wireless power receiver 300.

The wireless power transmitter 200 may transmit the power provided from the power supply device 100 to the wireless power receiver 300 by using an electromagnetic induction or resonance scheme.

Hereinafter the power transmission process between the wireless power transmitter 200 and the wireless power receiver 300 will be described in more detail.

The power supply device 100 generates AC power having a predetermined frequency and transmits the AC power to the transmission induction coil 210 of the wireless power transmitter 200. The AC power transmitted to the transmission induction coil 210 may be transferred to the transmission resonant coil 220 by using an electromagnetic induction scheme. That is, the transmission induction coil 210 and the transmission resonant coil 220 are inductively coupled with each other.

If AC current flows through the transmission induction coil 210 due to the AC power received from the power supply device 100, the AC current is induced to the transmission resonant coil 220 physically spaced apart from the transmission induction coil 210 due to the electromagnetic induction, so that the AC power may be transferred to the transmission resonant coil 220.

The transmission resonant coil 220 may transmit the AC power received from the transmission induction coil 210 to the reception coil 340 of the wireless power receiver 300 by using a resonant or electromagnetic induction scheme.

When the transmission resonant coil 220 transmits power to the reception coil 340 by using a resonance scheme, the transmission resonant coil 220 and the reception coil 340 are resonantly coupled with each other to be operated in the resonant frequency band. Since the transmission resonant coil 220 is resonantly coupled with the reception coil 340, the power transmission efficiency between the wireless power transmitter 200 and the wireless power receiver 300 may be significantly improved.

The frequency band of the power transmitted from the transmission resonant coil 220 to the reception coil 340 by using a resonance scheme may be different from that of the power transmitted from the transmission resonant coil 220 to the reception coil 340 by using a microelectronic induction scheme.

According to an embodiment, when the transmission resonant coil 220 transmits the power to the reception coil 340 by using a resonance scheme, the frequency band of the power to be transmitted may be 6.78 MHz, but the embodiment is not limited thereto.

According to an embodiment, when the transmission resonant coil 220 transmits the power to the reception coil 340 by using an electromagnetic induction scheme, the frequency band of the power to be transmitted may be in the range of 110 MHz to 205 MHz, but the embodiment is not limited thereto.

Figure 4:
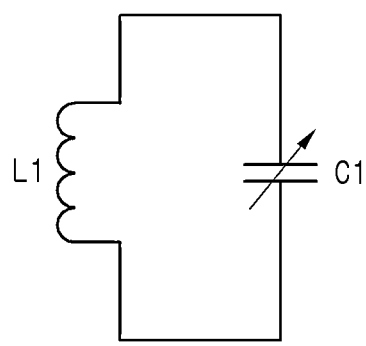
FIG. 4 is an equivalent circuit diagram of the transmission induction coil according to an embodiment.

FIG. 4 is an equivalent circuit diagram of the transmission induction coil 210 according to an embodiment.

As shown in FIG. 4, the transmission induction coil 210 may include an inductor L1 and a capacitor C1, and a circuit having a desirable inductance and a desirable capacitance can be constructed by the inductor L1 and the capacitor C1.

The transmission induction coil 210 may be constructed as an equivalent circuit in which both terminals of the inductor L1 are connected to both terminals of the capacitor C1. In other words, the transmission induction coil 210 may be constructed as an equivalent circuit in which the inductor L1 is connected to the capacitor C1 in parallel.

The capacitor C1 may include a variable capacitor, and impedance matching may be performed by adjusting the capacitance of the capacitor C1. The equivalent circuit of the transmission resonant coil 220, the reception resonant coil 310 and the reception induction coil 320 shown in FIGS. 1 to 3 may be the same as the equivalent circuit shown in FIG. 4.

Figure 5:
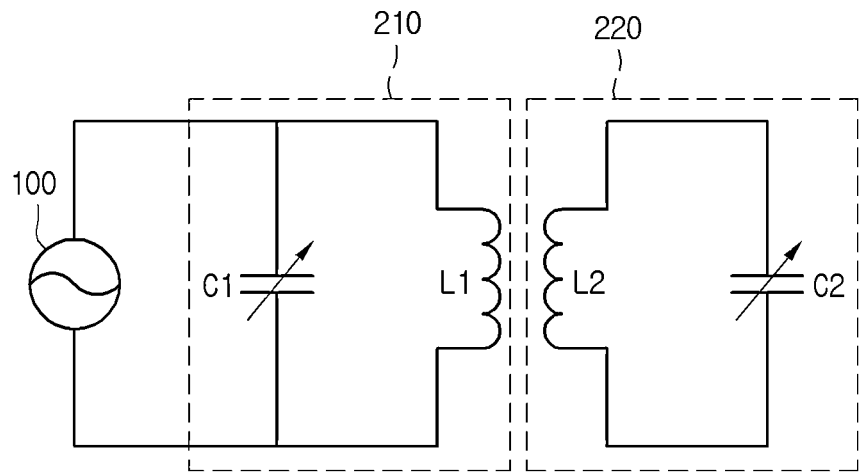
FIG. 5 is an equivalent circuit diagram of the power supply device and the wireless power transmitter according to an embodiment.

FIG. 5 is an equivalent circuit diagram of the power supply device 100 and the wireless power transmitter 200 according to an embodiment. FIG. 5 is an equivalent circuit diagram of the wireless power transmitter 200 shown FIGS. 1 and 3, but the wireless power transmitter 200 shown in FIG. 2 does not include the transmission resonant coil 220 shown in FIG. 5.

As shown in FIG. 5, the transmission induction coil 210 and the transmission resonant coil 220 may be constructed by using inductors L1 and L2 and capacitors C1 and C2 having predetermined inductances and capacitances, respectively.

Figure 6:
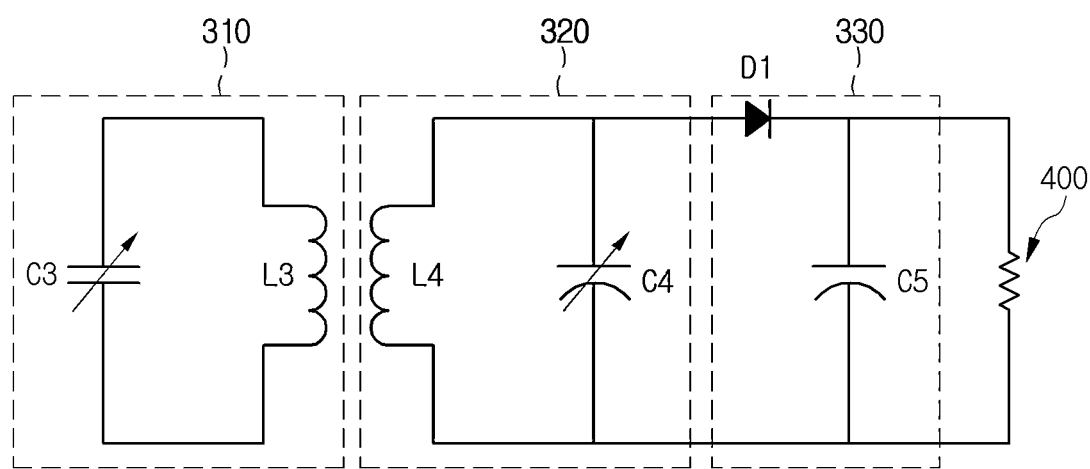
FIG. 6 is an equivalent circuit diagram of the wireless power receiver according to an embodiment.

FIG. 6 is an equivalent circuit diagram of the wireless power receiver 300 according to an embodiment.

FIG. 6 is an equivalent circuit diagram of the wireless power receiver 300 shown in FIG. 1, but the wireless power receiver 300 shown in FIGS. 1 and 2 does not include the reception induction coil 320 shown in FIG. 6.

As shown in FIG. 6, the reception resonant coil 310 and the reception induction coil 320 may be constructed by using inductors L3 and L4, and capacitors C3 and C4 having predetermined inductances and capacitances, respectively.

The rectifying circuit 330 may convert AC power transferred from the reception induction coil 320 into DC power and may transfer the DC power to the load 400.

The rectifying circuit 330 may include a rectifier and a smoothing circuit. The rectifier may include a silicon rectifier and as shown in FIG. 4, may be equivalent to a diode D1.

The rectifier may convert AC power transferred from the reception induction coil 320 into DC power.

The smoothing circuit may remove AC components included in the DC power converted by the rectifier to output a smoothed DC power. According to an embodiment, as shown in FIG. 6, a rectifying capacitor C5 may be used as the smoothing circuit, but the embodiment is not limited thereto.

The load 400 may be an arbitrary rechargeable battery or a device requiring the DC power. For example, the load 400 may refer to a battery.

The wireless power receiver 300 may be installed in an electronic device, such as a cellular phone, a laptop computer or a mouse, requiring the power.

Figure 7:
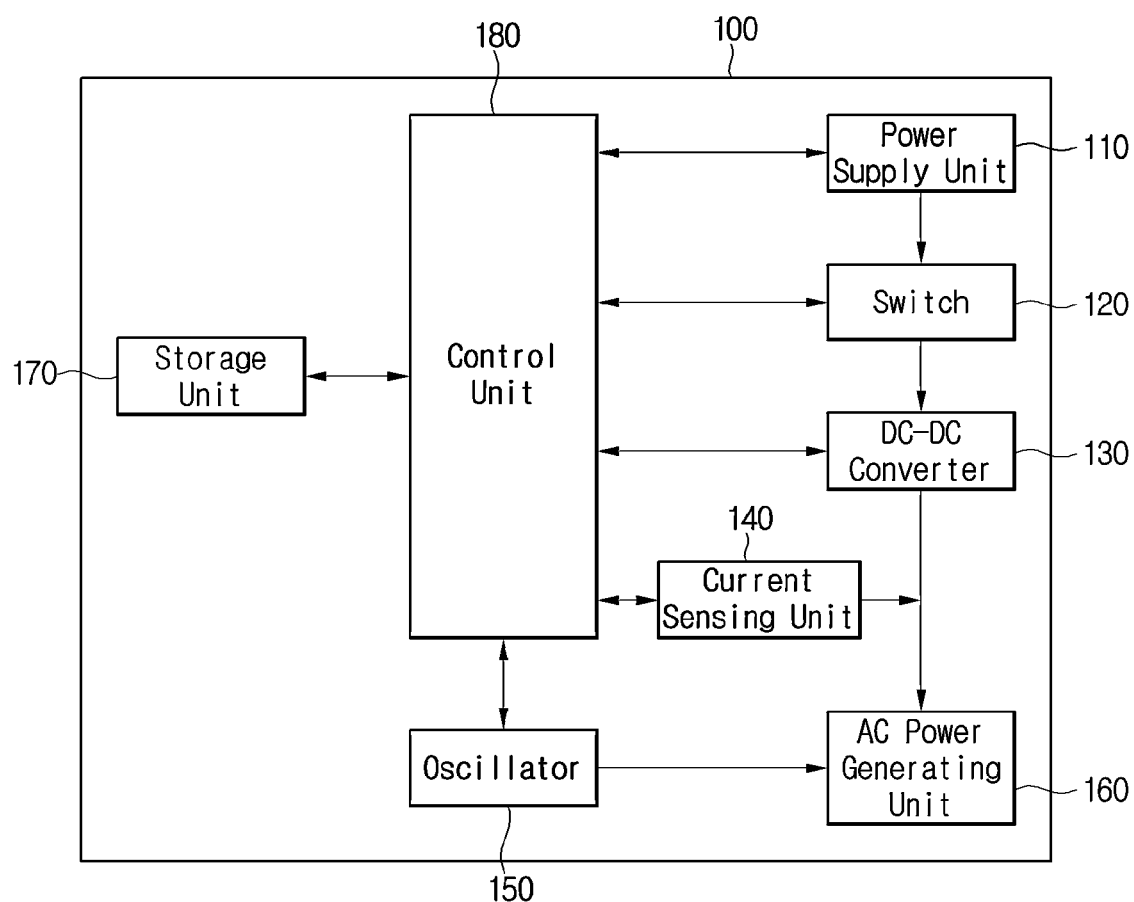
FIG. 7 is a block diagram showing a power supply device according to an embodiment.

FIG. 7 is a block diagram showing a power supply device according to an embodiment.

The power supply device 100 may generate AC power and supply the AC power to the wireless power transmitter 200 illustrated in FIGS. 1 to 3.

Referring to FIG. 7, the power supply device 100 may include a power supply unit 110, a switch 120, a DC-DC converter 130, a current sensing unit 140, an oscillator 150, an AC power generating unit 160, a storage unit 170 and a control unit 180.

The power supply unit 110 may supply DC power to each component of the power supply device 100. The power supply unit 110 may be provided separately from the power supply device 100.

The switch 120 may connect the power supply unit 110 with the DC-DC converter 130, or disconnect the power supply unit 110 from the DC-DC converter 130. The switch 120 may be opened or shorted by an open signal or a short signal of the control unit 180. According to one embodiment, the switch 120 may be open or shorted under the control of the control unit 180 according to the power transmission state between the wireless power transmitter 200 and the wireless power receiver 300.

The DC-DC converter 130 may convert DC voltage, which is received from the power supply unit 110, into DC voltage having a predetermined voltage value to be output.

After converting the DC voltage received from the power supply unit 110 into AC voltage, the DC-DC converter 130 may boost up or drop down and rectify the converted AC voltage, and output the DC voltage having a predetermined voltage value.

The DC-DC converter 130 may include a switching regulator or a linear regulator.

The linear regulator is a converter to receive input voltage to output a required quantity of voltage and to discharge the remaining quantity of voltage as heat.

The switching regulator is a converter capable of adjusting output voltage through a pulse width modulation (PWM) scheme.

The current sensing unit 140 may sense the current flowing through the power supply device 100 to measure the intensity of sensed current.

According to one embodiment, the current sensing unit 140 may measure the intensity of current flowing when the DC voltage output from the DC-DC converter 130 is applied to the AC power generating unit 160, but the embodiment is not limited thereto. In other words, the current sensing unit 140 may measure the intensity of current output from the AC power generating unit 160.

According to an embodiment, the current sensing unit 140 may include a current transformer (CT). According to an embodiment, the intensity of current applied to the AC power generating unit 160 may be utilized to find out the distance between the wireless power transmitter 200 and the wireless power receiver 300. According to an embodiment, the intensity of current applied to the AC power generating unit 160 may be utilized to find out a coupling coefficient between the wireless power transmitter 200 and the wireless power receiver 300. According to an embodiment, the intensity of the current applied to the AC power generating unit 160 may serve as an index to represent the coupling state between the wireless power transmitter 200 and the wireless power receiver 300. The coupling state may be used to obtain the coupling coefficient between the wireless power transmitter 200 and the wireless power receiver 300.

The current sensing unit 140 may transfer the signal corresponding to the intensity of the sensed current to the control unit 180.

Although the current sensing unit 140 is depicted in FIG. 7 as an element separated from the control unit 180, the current sensing unit 140 may be embedded in the control unit 180.

The oscillator 150 may generate an AC signal having a predetermined frequency and apply the AC signal to the AC power generating unit 160.

The AC power generating unit 160 may convert the DC voltage transferred from the DC-DC converter 130 into the AC voltage.

The AC power generating unit 160 may amplify the AC signal generated from the oscillator 150. A degree of amplifying the AC signal may be varied according to the DC voltage applied through the DC-DC converter 130.

According to an embodiment, the AC power generating unit 160 may include a push-pull type dual MOSFET.

The control unit 180 may control the overall operation of the power supply device 100.

The control unit 180 may control the DC-DC converter 130 so that preset DC voltage is applied to the AC power generating unit 160.

When the DC voltage output from the DC-DC converter 130 is applied to the AC power generating unit 160, the control unit 180 may receive a signal, which corresponds to the intensity of flowing current, from the current sensing unit 140, and may adjust the DC voltage output from the DC-DC converter 130 and the frequency of the AC signal output from the oscillator 150 by using the received signal.

The control unit 180 receives the signal, which corresponds to the intensity of the current applied to the AC power generating unit 160, from the current sensing unit 140 to determine if the wireless power receiver 300 exists. That is, the control unit 180 may identify whether the wireless power receiver 300 capable of receive power from the wireless power transmitter 200 based on the intensity of the current applied to the AC power generating unit 160 exists.

The control unit 180 may control the oscillator 150 such that an AC signal having a predetermined frequency is generated. The predetermined frequency may refer to a resonance frequency of the wireless power transmitter 200 and the wireless power receiver 300 when the power transmission is performed by using resonance.

The storage unit 170 may store the intensity of the current applied to the AC power generating unit 160, the coupling coefficient between the wireless power transmitter 200 and the wireless power receiver 300, and the DC voltage output from the DC-DC converter 130 corresponding to each other. That is, the storage unit 170 may store the current intensity, the coupling coefficient and the DC voltage in the form of a look-up table.

The control unit 180 may search for a coupling coefficient corresponding to the intensity of the current applied to the AC power generating unit 160 and DC voltage output from the DC-DC converter 130 in the storage unit 170, and may control the DC-DC converter 130 so that the searched DC voltage may be output.

Hereinafter an embodiment of the wireless power transmitter 200 will be described with reference to FIGS. 1 to 7.

Figure 8:
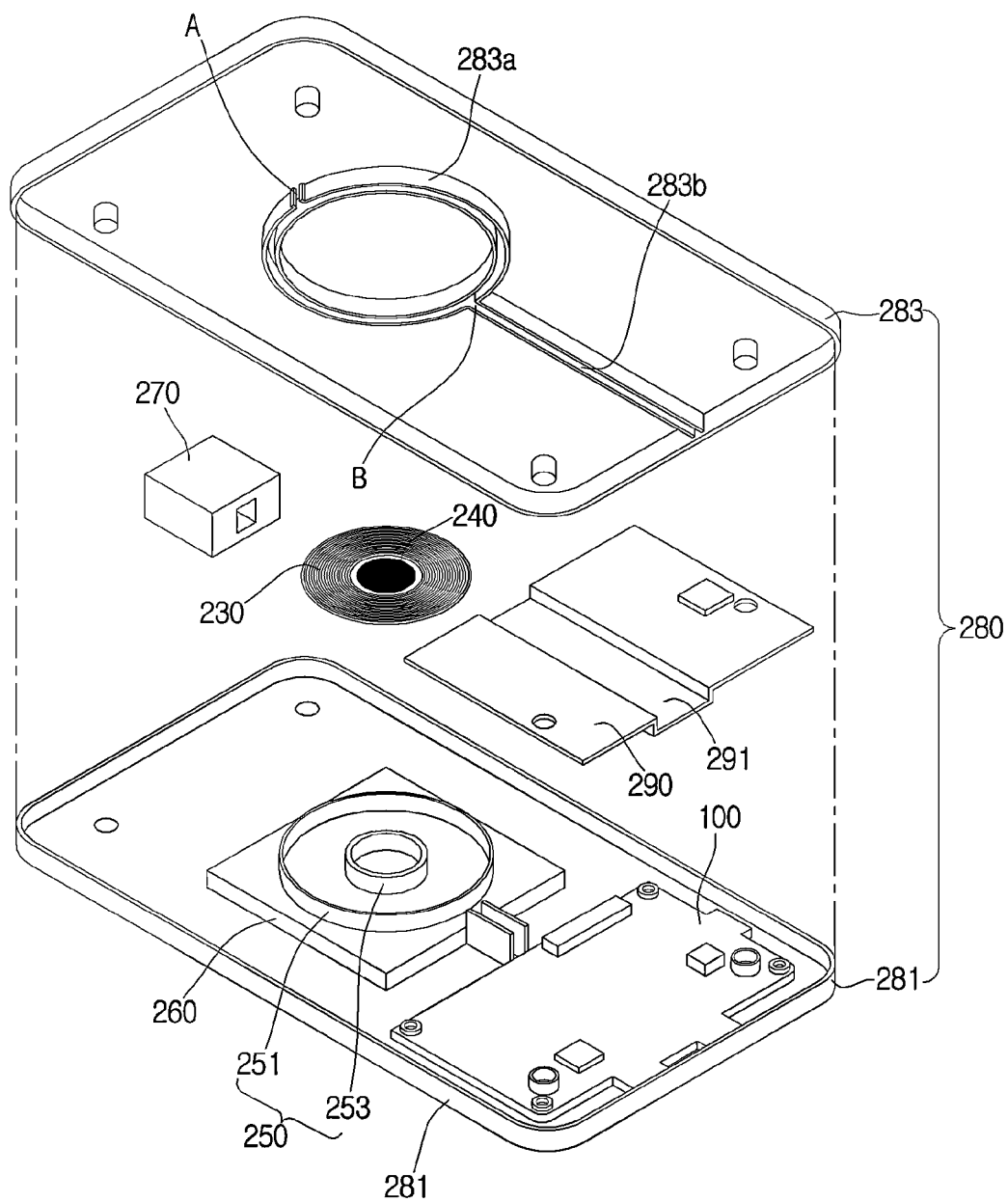
FIG. 8 is an exploded perspective view showing a wireless power transmitter according to an embodiment.
Figure 9:
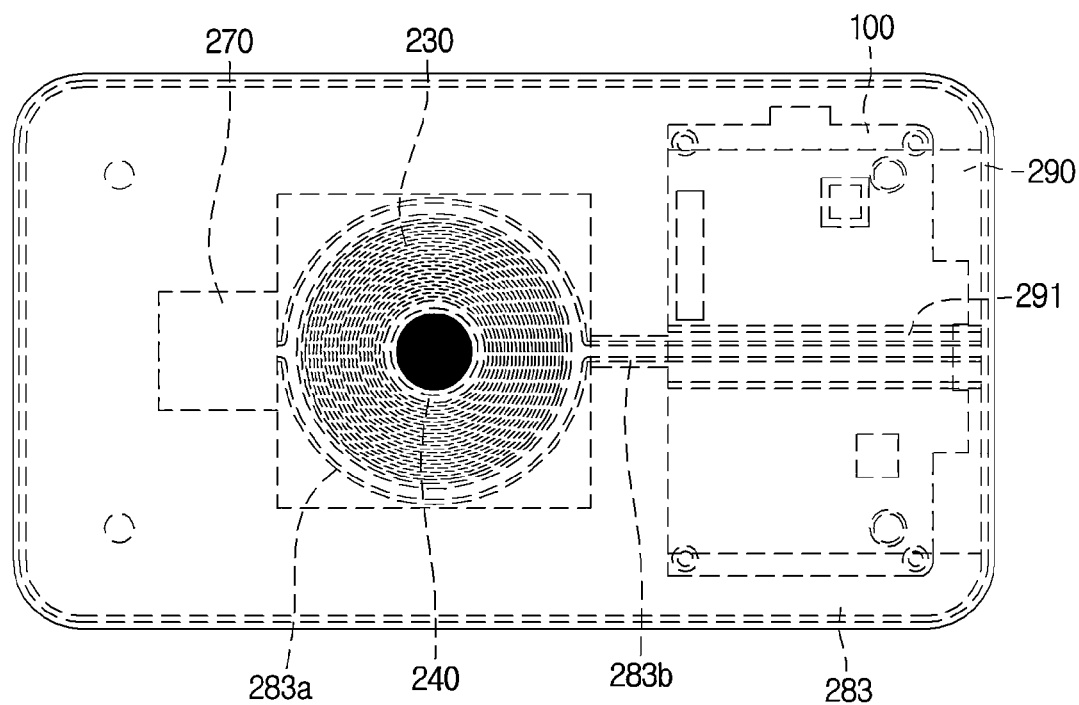
FIG. 9 is a plan projection view showing a wireless power transmitter according to an embodiment.

FIG. 8 is an exploded perspective view showing a wireless power transmitter according to an embodiment. FIG. 9 is a plane projection view showing a wireless power transmitter according to an embodiment.

Referring to FIGS. 8 and 9, a wireless power transmitter 200 may include a power supply device 100, a transmission coil 230, a magnet 240, a transmission coil receiving unit 250, a shielding unit 260, an inlet device 270, a case 280 and a heat radiation member 290.

The power supply device 100 may generate AC power and supply the AC power to the transmission coil 230. In an embodiment, the power supply device 100 may include the elements illustrated in FIG. 7. The elements of the power supply device 100 may be disposed on a printed circuit board (PCB) and may be electrically connected to a wire layer of the PCB.

In detail, the power supply device 100 may include a power inductor which serves as the DC-DC converter 130, a matching capacitor for matching a frequency of power transmitted to the transmission coil 230, and a transmission circuit including the elements illustrated in FIG. 7. The power inductor, the matching capacitor and the transmission circuit may be mounted on the PCB.

The transmission coil 230 may wirelessly transmit the power received from the power supply device 100 to a wireless power receiver (not shown).

When the wireless power transmitter 200 transmits power to the wireless power receiver (not shown) through an electromagnetic induction scheme, the transmission coil 230 may correspond to the transmission induction coil 210 of FIG. 2. When the wireless power transmitter 200 transmits power to the wireless power receiver (not shown) through a resonance scheme, the transmission coil 230 may correspond to the transmission resonant coil 220 of FIG. 1. A transmission induction coil 210 may be further disposed to one side adjacent to the transmission coil 230.

In an embodiment, the transmission coil 230 may have one of the spiral and helical structures, but the embodiment is not limited thereto.

The magnet 240 may be disposed inside the transmission coil 230 so that the transmission coil 230 and the reception coil included in the wireless power receiver 300 may be arranged. In this case, a magnet may be provided even to the wireless power receiver. Due to the magnetic force between the magnets of the transmission coil 230 of the wireless power transmitter 200 and the wireless power receiver 300, the distance between the transmission coil 230 and the reception coil may be minimized.

For example, when a user places a terminal including the wireless power receiver on the wireless power transmitter 200 to charge the terminal, due to the magnetic force between the magnets of the wireless power transmitter 200 and the wireless power receiver 300, the reception coil of the wireless power receiver 300 may be adjacent to the transmission coil 230 of the wireless power transmitter 200, so that the terminal may be charged at a high power transmission efficiency.

The receiving unit 250 may be disposed at a lower case, which will be described below, to receive the transmission coil 230 and the magnet 240. That is, the receiving unit 250 may include a transmission coil receiving unit 251 for receiving the transmission coil 230 and a magnet receiving unit 253 for receiving the magnet 240.

As shown in FIG. 8, the transmission coil receiving unit 251 and the magnet receiving unit 253 may have cylindrical shapes with upper portions open, but the embodiment is not limited thereto. In addition, the transmission coil receiving unit 251 and the magnet receiving unit 253 may have various shapes according to the shapes of the transmission coil 230 and the magnet 240.

The shield unit 260 may be disposed below the receiving unit 250 to change a direction of a magnetic field formed on the transmission coil 230 into a side direction, so that the magnetic field may be concentrically transferred to the wireless power receiver.

Further, the shielding unit 260 may absorb a part of the magnetic field formed on the transmission coil 230 and radiate the absorbed magnetic field as heat, so that an amount of the magnetic field exposed to an outside may be reduced. Due to the shielding unit 260, a part of the magnetic field formed on the transmission coil 230 is inhibited from leaking to an outside, so that the leakage of the magnetic field harmful to human health may be minimized.

According to an embodiment, the shielding unit 260 may include a ferrite-type magnetic substance or a sandust-type magnetic substance, but the embodiment is not limited thereto.

The inlet device 270 may be disposed on one side of the transmission coil 230 to provide air to the transmission coil 230, so that the heat generated from the transmission coil 230 may be radiated.

The inlet device 270 may periodically provide air to the transmission coil 230 so that the heat generated from the transmission coil 230 may be radiated to an outside. That is, since the transmission coil 230 includes a resistance component, as current flows through the transmission coil 230, heat is generated due to the resistance component. In this case, the inlet device 270 may radiate the heat generated by the resistance component of the transmission coil 230 to an outside.

According to an embodiment, the inlet device 270 may be a blower for blowing out air forcedly generated through a pumping to the transmission coil 230.

According to an embodiment, the inlet device 270 may be a fan for providing air to the transmission coil 230 through an impeller.

A process of radiating the heat generated from the transmission coil 230 to an outside through the inlet device 270 will be described below.

The case may include a lower case 281 and an upper case 283.

The power supply device 100, the transmission coil 230, the magnet 240, a receiving unit 250, the inlet device 270 and the heat radiation member 290 are disposed in the lower case 281.

The upper case 283 may be coupled to the lower case 281. In detail, the upper case 283 may include first and second passage grooves 283a and 283b. The upper and lower cases 283 and 281 may be coupled to each other by coupling the transmission coil receiving unit 251 of the lower case 281 to the first passage groove 283a of the upper case 283.

The inlet device 270 and the first and second passage grooves 283a and 283b are called a radiation unit, but the embodiment is not limited thereto.

An area formed by the first passage groove 283a may correspond to an area formed by the transmission coil receiving unit 251.

The first passage groove 283a may be in a form of surrounding an outer periphery of the transmission coil 230.

An inlet portion A through which air is input from the inlet device 270 may be formed at one side of the first passage groove 283a, and an outlet portion B through which the air input through the inlet portion A is output into the second passage groove 283b may be formed at an opposite side of the first passage groove 283a.

The second passage groove 283b may communicate with the outlet portion B so that the air blowing out through the outlet portion B may be output to an outside of the wireless power transmitter 200.

The second passage groove 283b may have a straight line shape.

The second passage groove 283b may radiate heat dispersed from the heat radiation member 290 described below. The heat radiation member 290 may have a sheet shape.

The heat radiation member 290 may be disposed over the power supply device 100 so that the heat radiation member 290 may radiate the heat generated from the power supply device 100 to the outside. In detail, the heat radiation member 290 may have an area corresponding to that of the power supply device 100 and may disperse the heat generated from the power supply device 100 in x-y plane direction to guide the dispersed heat toward the second passage groove 283b of the upper case 283. The heat dispersed by the heat radiation member 290 is guided into the second passage groove 283b of the upper case 283, so that the heat may be radiated to an outside.

A groove 291 having a shape corresponding to that of the second passage groove 283b of the upper case 283 may be formed in the heat radiation member 290. That is, the heat generated by the power supply device 100 and dispersed by the heat radiation member 290 may be introduced into the groove 291, so that the heat introduced into the groove 291 may be radiated to an outside through the second passage groove 283b.

According to an embodiment, the heat radiation member 290 may be formed of a material including one of graphite, boron nitride and silicon.

According to an embodiment, the wireless power transmitter 200 may be fabricated in a pad shape. When a terminal having the wireless power receiver is positioned on the wireless power transmitter 200 formed in the pad shape, the battery installed in the terminal may be easily charged.

Next, a process of radiating heat generated in the wireless power transmitter 200 will be described in detail with reference to FIGS. 8 and 9.

Figure 10:
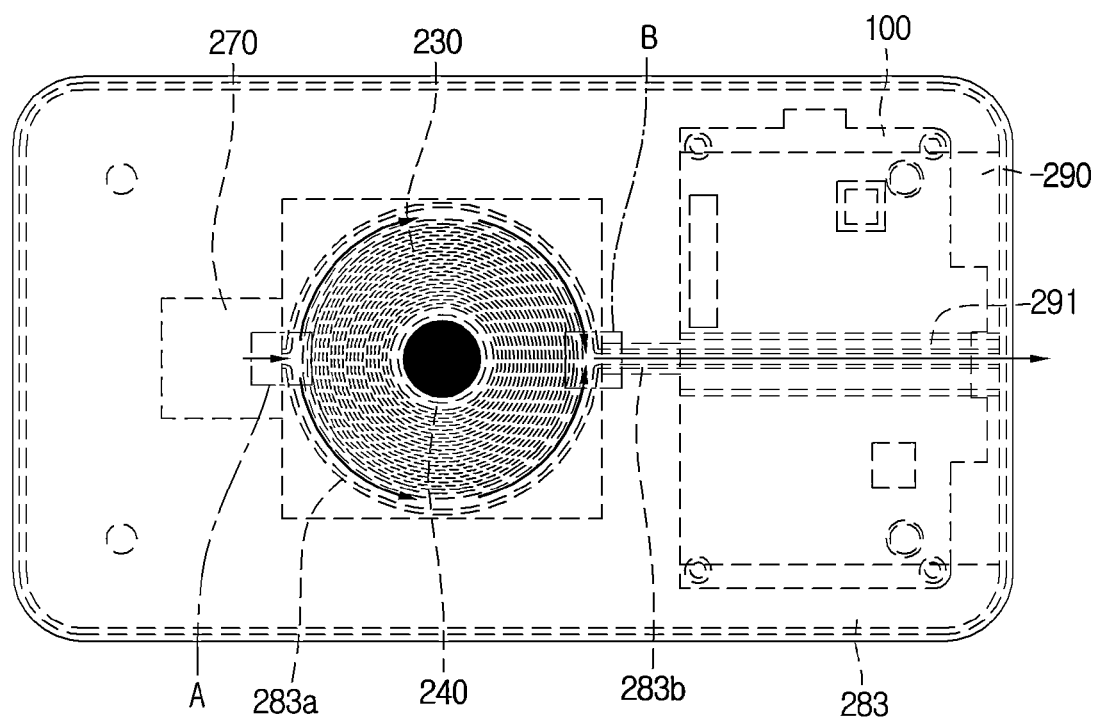
FIG. 10 is a plane projection view of the wireless power transmitter for the purpose of illustrating a process of radiating heat generated from the wireless power transmitter according to an embodiment.

FIG. 10 is a plane projection view of the wireless power transmitter 200 for the purpose of illustrating a process of radiating heat generated from the wireless power transmitter 200 according to an embodiment.

Referring to FIG. 10, air is introduced into the inlet portion A of the first passage groove 283a through the inlet device 270. The inlet device 270 may periodically allow air to flow into the inlet portion A of the first passage groove 283a.

The air input to the inlet portion A flows into the outlet portion B of the first passage groove 283a along the first passage groove 283a and the heat radiated from the outlet portion B flows out to an outside through the second passage groove 283b. In this case, the heat generated from the transmission coil 230 may flow into the first passage groove 283a and the inflow heat may be radiated to an outside through the second passage groove 283b communicating with the outlet portion B of the first passage groove 283a.

Further, the heat generated from the power supply device 100 and dispersed by the heat radiation member 290 may flow into the groove 291 of the heat radiation member 290 and introduced into the groove 291 of the heat radiation member 290, so that the heat flowing into the groove 291 may flow into the second passage groove 283b to be radiated to an outside.

As described above, the wireless power transmitter 200 may radiate the heat generated from the transmission coil 230 and the power supply device 100 so that the internal temperature of the wireless power transmitter 200 may be decreased, so the wireless power transmitter 200 may be inhibited from being deteriorated.

In addition, when the terminal including the wireless power receiver on the wireless power transmitter 200 having the pad shape is charged, the heat generated from the wireless power transmitter 200 may be inhibited from transferring to the terminal.

Hereinafter the temperature reduction in the wireless power transmitter 200 according to the embodiment will be described with reference to FIGS. 11 to 13.

Figure 11:
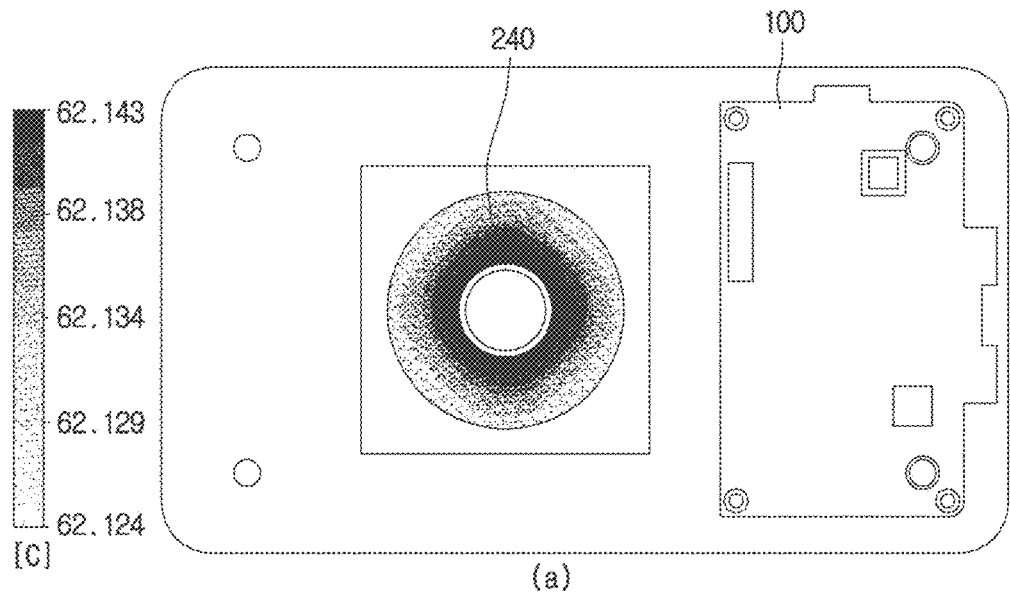
FIG. 11 is a view illustrating a variation of temperature near the transmission coil according to whether the wireless power transmitter of the embodiment is used.
Figure 11:
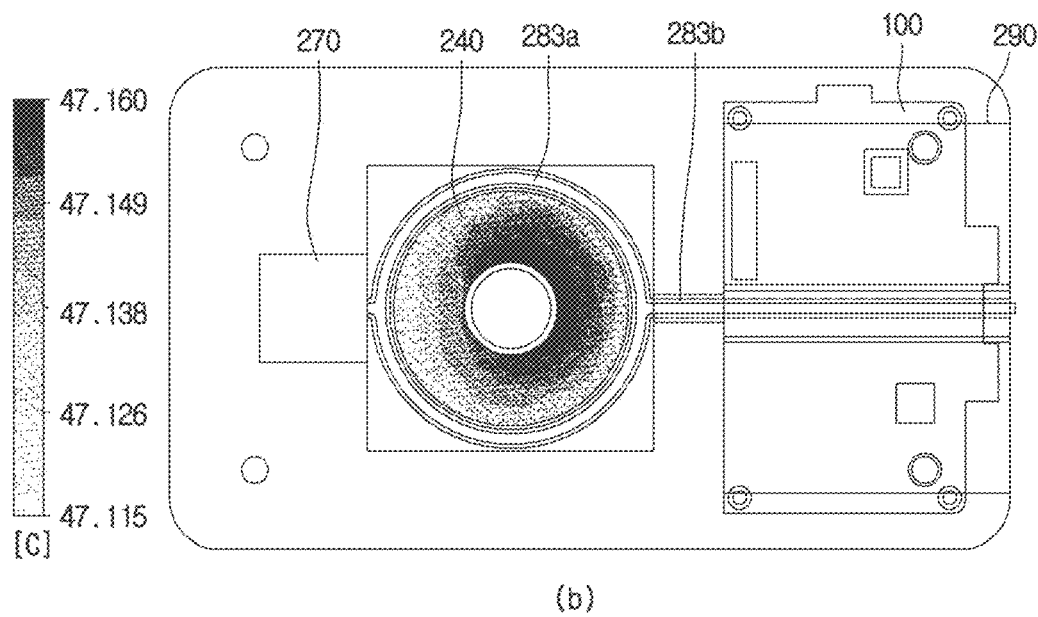

FIG. 11 is a view illustrating a variation of temperature near the transmission coil 230 according to whether the wireless power transmitter of the embodiment is used.

FIG. 11 (a) shows an experiment result of temperature near the transmission coil 230 when the wireless power transmitter 200 of the embodiment is not used. FIG. 11 (b) shows an experiment result of temperature near the transmission coil 230 when the wireless power transmitter 200 of the embodiment is used.

The experiment results of FIG. 11 are obtained when the transmission coil 230 transmits power to a receiving part through an electromagnetic induction scheme.

The calorific value of the transmission coil 230 is 230,000 Watt/$m^3$ under a basic experiment condition, the calorific value of the power inductor (FET) is 200,000 Watt/m3, the calorific value of the matching capacitor is 50,000 Watt/$m^3$, a natural convection coefficient of the case 280 is 5 Watt/(m2K), and external temperature is 25°.

Material properties of the elements of the wireless power transmitter 200 will be described with reference to FIG. 12.

FIG. 12 is a view showing properties of the elements of the wireless power transmitter 200 according to an embodiment.

FIG. 12 shows materials and thermal conductivities of each element of the wireless power transmitter 200.

When comparing FIG. 11 (a) with FIG. 11 (b), the temperature near the transmission coil 230 is 62.1° C. when the wireless power transmitter 200 is not used, but the temperature near transmission coil 230 is 47.1° C. when the wireless power transmitter 200 is used, so that the temperature of about 15° C. is decreased. That is, the heat generated from the transmission coil 230 due to the configuration of the wireless power transmitter 200 is radiated to an outside so that the temperature near the transmission coil 230 may be decreased.

Figure 13:
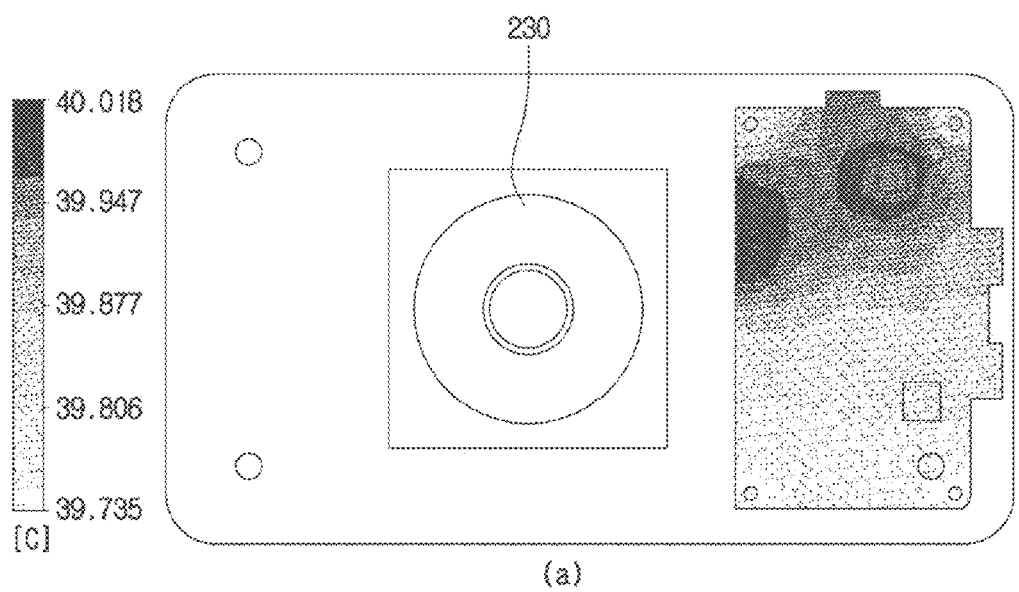
FIG. 13 is a view illustrating a variation of temperature near the power supply device according to whether the wireless power transmitter of the embodiment is used.
Figure 13:
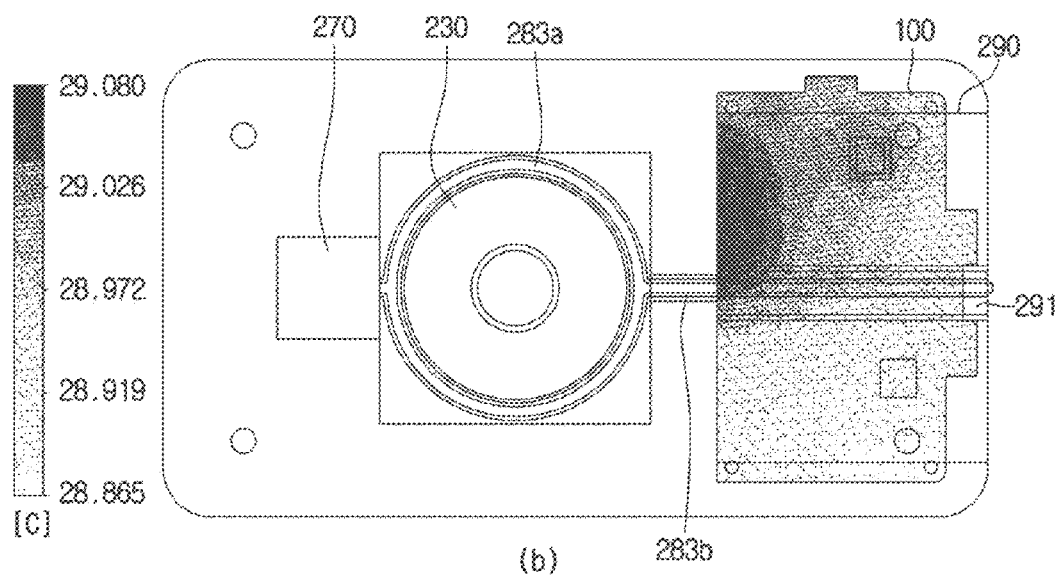

FIG. 13 is a view illustrating a variation of temperature near the power supply device 100 according to whether the wireless power transmitter 200 of the embodiment is used.

FIG. 13 (a) shows an experiment result of temperature near the power supply device 100 when the wireless power transmitter 200 of the embodiment is not used. FIG. 13 (b) shows an experiment result of temperature near the power supply device 100 when the wireless power transmitter 200 of the embodiment is used.

Since the experiment condition of FIG. 13 is the same as that of FIGS. 11 and 12, the detailed description will be omitted.

When comparing FIG. 13 (a) with FIG. 13 (b), the temperature near the power supply device 100 is 40° C. when the wireless power transmitter 200 is not used, but the temperature near the power supply device 100 is 29° C. when the wireless power transmitter 200 is used, so that the temperature of about 11° C. is decreased. That is, the heat generated from the power supply device 100 due to the configuration of the wireless power transmitter 200 is radiated to an outside so that the temperature near the transmission coil 230 may be decreased.

According to the embodiment, the heat is radiated from the transmission coil so that the wireless power transmitter and the wireless power receiver may be inhibited from being deteriorated.

The transmission coil and the reception coil provided in the wireless power receiver may be effectively arranged through the magnet disposed inside the transmission coil, so that the power transmission efficiency may be improved.

Meanwhile, any other various effects will be directly and implicitly described below in the description of the embodiment.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A wireless power transmitter comprising:
   a first case;
   a coil on the first case, wherein the coil wirelessly transmits power to a wireless power receiver;
   a first passage groove having a shape corresponding to a shape of the coil;
   a second case coupled to the first case;
   an inlet device connected to one side of the first passage groove to inject air into the first passage groove;
   a power supply device connected to the coil to supply power to the coil;
   a heat radiation member on the power supply device; and
   a second passage groove connected to an opposite side of the first passage groove and disposed on the heat radiation member.

2. The wireless power transmitter of claim 1, further comprising a coil receiving unit on the first case to receive the coil,
   wherein the first passage groove is coupled to the coil receiving unit.

3. The wireless power transmitter of claim 2, wherein the coil is surrounded by the first passage groove and the coil receiving unit.

4. The wireless power transmitter of claim 2, further comprising:
   a magnet inside the coil; and
   a magnet receiving unit on the first case to receive the magnet.

5. The wireless power transmitter of claim 4, further comprising a shielding unit below the coil receiving unit and the magnet receiving unit.

6. The wireless power transmitter of claim 1, wherein the first passage groove surrounds an outer periphery of the coil.

7. The wireless power transmitter of claim 1, wherein the first passage groove is provided on the second case.

8. The wireless power transmitter of claim 1, wherein the first passage groove has a close-loop structure.

9. The wireless power transmitter of claim 1, wherein the heat radiation member includes a groove having a shape corresponding to a shape of the second passage groove.

10. The wireless power transmitter of claim 9, wherein the second passage groove is disposed in the groove of the heat radiation member.

11. The wireless power transmitter of claim 1, wherein the heat radiation member has an area corresponding to an area of the power supply device.

12. The wireless power transmitter of claim 1, wherein the first passage groove includes first and second sub-passage grooves, the first and second sub-passage grooves divided from each other at a first inlet unit connected to the inlet device and met with each other at a second inlet unit connected to the second passage groove.

13. The wireless power transmitter of claim 1, wherein the inlet device includes one of a blower and a fan.

14. A wireless power transmitter, comprising:
   a transmission coil to wirelessly transmit power to a wireless power receiver;
   an inlet device on one side of the transmission coil to supply air to the transmission coil;
   a radiation unit to radiate heat of the transmission coil by changing a movement path of the supplied air, wherein the radiation unit includes a first passage groove connected to the inlet device;
   a power supply device connected to the transmission coil to supply power to the transmission coil;
   a heat radiation member on the power supply device; and
   a second passage groove connected to an opposite side of the first passage groove and disposed on the heat radiation member.

15. The wireless power transmitter of claim 14, wherein the first passage groove has a close loop structure corresponding to a shape of the transmission coil.

16. The wireless power transmitter of claim 14, wherein the first and second passage grooves are disposed on a case.

* * * * *